US012660571B2

(12) United States Patent    (10) Patent No.:   US 12,660,571 B2

Ohtsuki et al.      (45) Date of Patent:    Jun. 16, 2026

(54) METHOD FOR FORMING THERMAL OXIDE FILM ON SEMICONDUCTOR SUBSTRATE AND METHOD FOR PRODUCING SEMICONDUCTOR DEVICE

(71) Applicant: SHIN-ETSU HANDOTAI CO., LTD., Tokyo (JP)

(72) Inventors: Tsuyoshi Ohtsuki, Annaka (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 379 days.

(21) Appl. No.: 18/566,907

(22) PCT Filed: Jun. 6, 2022

(86) PCT No.: PCT/JP2022/022701

§ 371 (c)(1),
(2) Date: Dec. 4, 2023

(87) PCT Pub. No.: WO2022/264843

PCT Pub. Date: Dec. 22, 2022

(65) Prior Publication Data

US 2024/0274477 A1     Aug. 15, 2024

(30) Foreign Application Priority Data

Jun. 15, 2021    (JP) ................................. 2021-099586

(51) Int. Cl.
*H10P 74/00*      (2026.01)
*H10P 14/60*      (2026.01)
(Continued)

(52) U.S. Cl.
CPC .......... *H10P 74/23* (2026.01); *H10P 14/6309* (2026.01); *H10P 14/6322* (2026.01);
(Continued)

(58) Field of Classification Search
CPC ... H10P 74/23; H10P 14/6309; H10P 14/6322
See application file for complete search history.

(56) References Cited

U.S. PATENT DOCUMENTS

| | | | |
|---|---|---|---|
| 3,892,891 A | 7/1975 | Goodman et al. | |
| 5,693,578 A | * 12/1997 | Nakanishi | ............... H10P 70/12 438/770 |
| 6,235,651 B1 | * 5/2001 | Schrems | ............. H10P 14/6322 438/770 |

FOREIGN PATENT DOCUMENTS

| | | |
|---|---|---|
| DE | 2131559 A1 | 1/1972 |
| JP | H09-063910 A | 3/1997 |

(Continued)

OTHER PUBLICATIONS

Extended European Search Report in application No. 22824835.7 issued May 13, 2025.

(Continued)

*Primary Examiner* — Errol V Fernandes
(74) *Attorney, Agent, or Firm* — Harness, Dickey & Pierce, P.L.C.

(57) ABSTRACT

The present invention provides a method for forming a thermal oxide film, comprising the steps of: a step of acquiring a first correlation between an amount of OH groups and thickness of the thermal oxide film by forming a thermal oxide film by thermal oxidation treatment under the same condition after preparing a plurality of semiconductor substrates having chemical oxide films formed by cleaning and having different amounts of OH groups; a step of acquiring a second correlation between an amount of OH groups and drying conditions by cleaning under the same cleaning condition followed by changed drying conditions to substrates and measuring amounts of OH groups; a step of acquiring a third correlation between drying condition and thickness of thermal oxide film by using the first (Continued)

First correlation acquisition step

Second correlation acquisition step

Third correlation acquisition step

Thermal oxide film thickness estimation step

Drying and thermal oxidation condition determining step

Cleaning step

Drying step

Thermal oxide film forming step correlation and the second correlation; a step of determining drying condition and thermal oxidation condition by using the third correlation; a step of cleaning the substrates; and a step of drying and a thermal oxide film formation after the cleaning step using the drying conditions and thermal oxidation treatment conditions determined in the drying and thermal oxidation treatment condition determination step. This provides a method for forming thermal oxide film in which a thermal oxide film can be formed with intended thickness with good reproducibility while without changing the composition of the cleaning chemical solution.

15 Claims, 3 Drawing Sheets

(51) Int. Cl.

| | | |
|---|---|---|
| *H10P 14/692* | (2026.01) | |
| *H10P 70/00* | (2026.01) | |
| *H10P 72/00* | (2026.01) | |

(52) U.S. Cl.
CPC ........ *H10P 14/69215* (2026.01); *H10P 70/23* (2026.01); *H10P 72/0406* (2026.01)

(56) References Cited

FOREIGN PATENT DOCUMENTS

| JP | 2001-044429 | A | 2/2001 |
|---|---|---|---|
| JP | 2014-082285 | A | 5/2014 |
| JP | 6791453 | B1 | 11/2020 |
| JP | 6791454 | B1 | 11/2020 |
| JP | 6838677 | B1 | 3/2021 |

OTHER PUBLICATIONS

International Preliminary Report on Patentability mailed Dec. 28, 2023, in corresponding International Application No. PCT/JP2022/022701.
International Search Report mailed Aug. 16, 2022, in corresponding International Application No. PCT/JP2022/022701.

* cited by examiner

[FIG. 1]
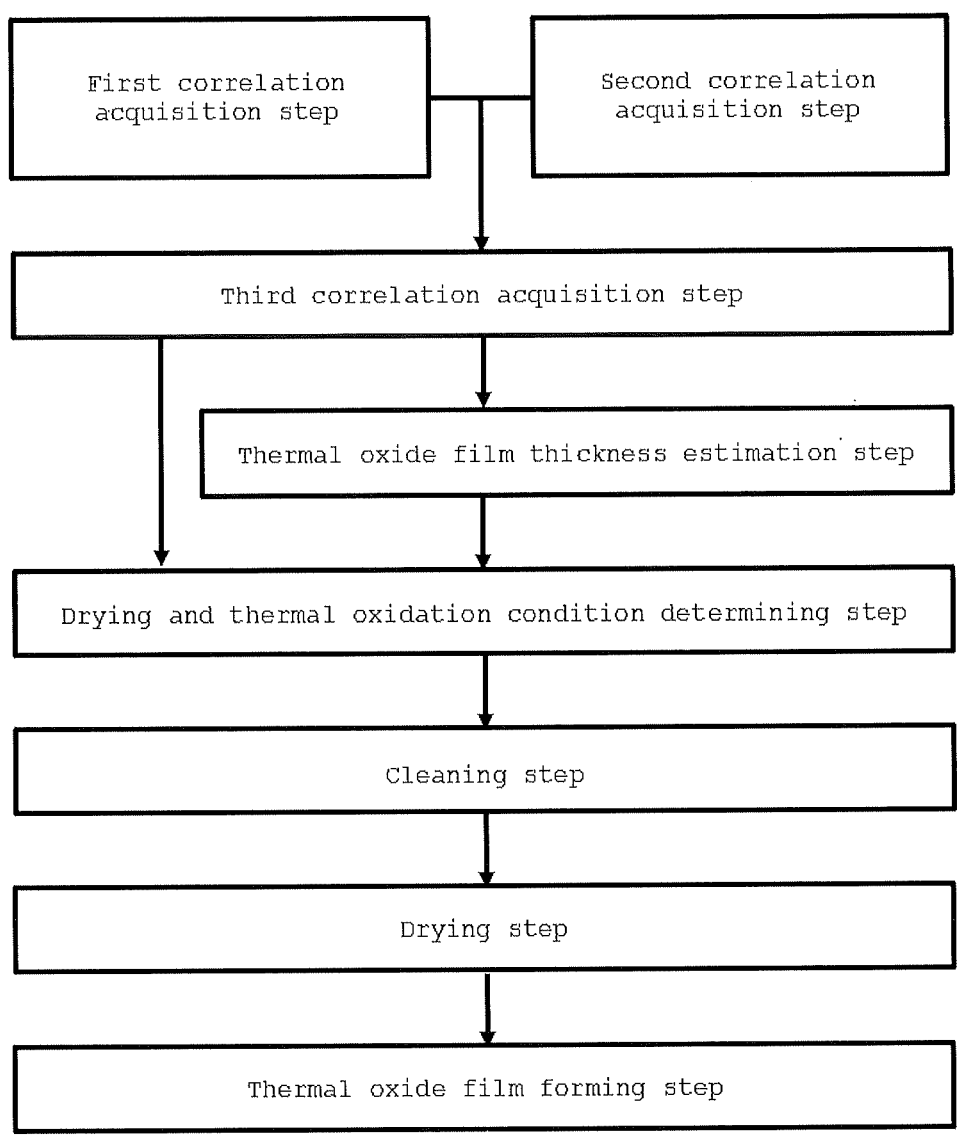

[FIG. 2]
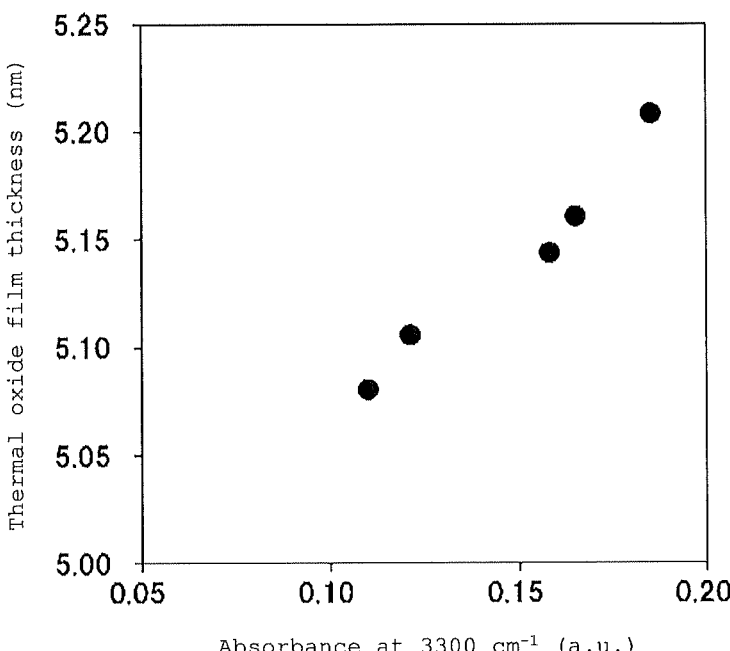
[FIG. 3]
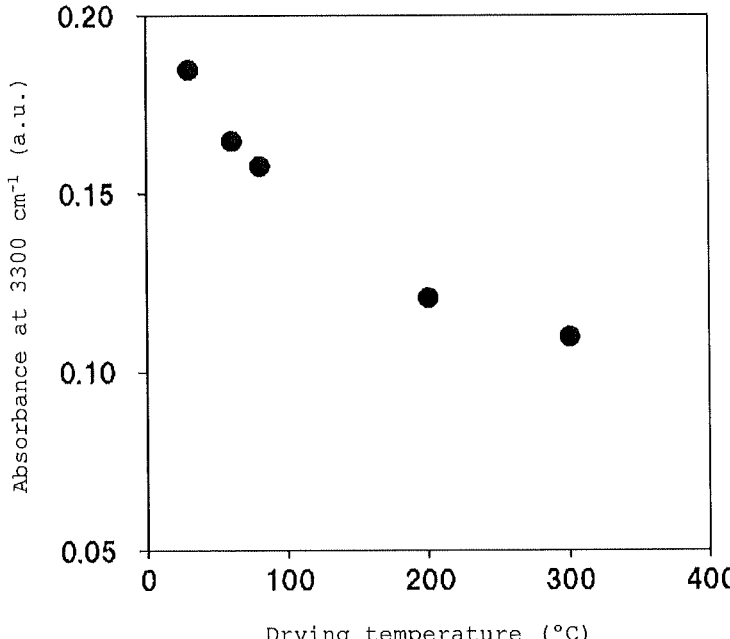

[FIG. 4]
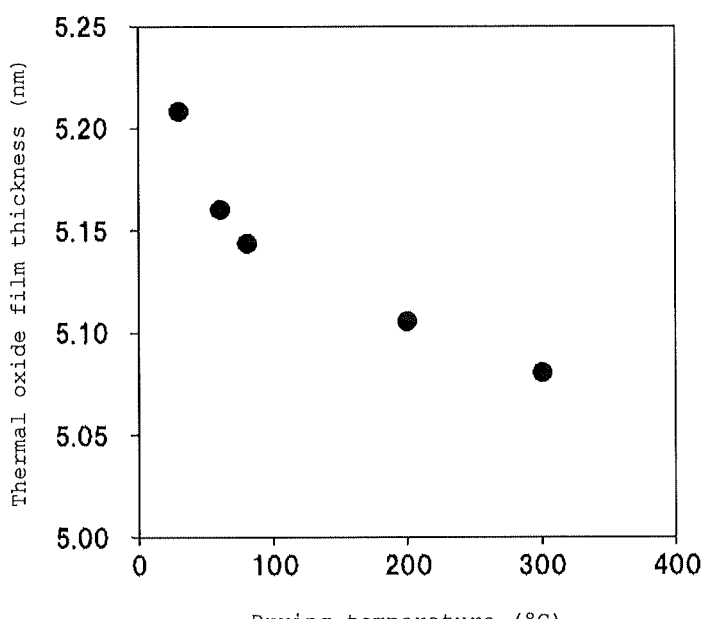

METHOD FOR FORMING THERMAL OXIDE FILM ON SEMICONDUCTOR SUBSTRATE AND METHOD FOR PRODUCING SEMICONDUCTOR DEVICE

CROSS-REFERENCE TO RELATED APPLICATIONS

This application is a U.S. National Phase Application under 35 U.S.C. 371 of International Application No. PCT/JP2022/022701, filed Jun. 6, 2022, which claims priority to Japanese Application No. 2021-099586, filed Jun. 15, 2021. The entire disclosures of the above applications are incorporated herein by reference.

TECHNICAL FIELD

The present invention relates to a method for forming a thermal oxide film on a semiconductor substrate and a method for producing a semiconductor device.

BACKGROUND ART

As semiconductor integrated circuit elements become multi-layered and thin, further thinning of various films constituting the elements is required. For example, in Patent Document 1, in bonding silicon wafers, the surface of the silicon wafer used needs to have OH groups, and a thin oxide film is formed on the surface by cleaning with a normal SC1 cleaning solution is stated.

CITATION LIST

Patent Literature

Patent Document 1: JP H09-063910 A
Patent Document 2: Japanese Patent No. 6791453
Patent Document 3: Japanese Patent No. 6791454

SUMMARY OF INVENTION

Technical Problem

In order to form such an ultra-thin silicon oxide film uniformly within a plane or between planes (between substrates) with good reproducibility, it has become impossible to ignore the existence of a natural oxide film or a chemical oxide film (an oxide film formed by cleaning the semiconductor substrate with a cleaning solution) formed beforehand on a semiconductor substrate.

In fact, according to investigation and research by the inventors of the present invention, it is known that, for example, if the cleaning method of the semiconductor substrate is different, the film thickness of the subsequent thermal oxide film will be different, and it is not dependent on the natural oxide film thickness before thermal oxidation nor the chemical oxide film thickness before the thermal oxidation. For this reason, until the semiconductor substrate is actually thermally oxidized and the thickness of the thermal oxide film is evaluated, the difference in thickness of the actually formed thermal oxide film is not known, and management of the thermal oxide film forming process has been difficult.

As a solution to this problem, the inventions described in Patent Document 2 and Patent Document 3 focus on the amount of OH groups in the natural oxide film after cleaning as a factor that affects the thickness of thin thermal oxide film, and have found that the film thickness of the thermal oxide film increase as the amount of OH groups increases, and specifically, the amount of OH groups has been adjusted by changing the composition of the cleaning chemical solution. However, as a result of further investigation and research, the inventors of the present invention have found a new problem that a change in the composition of the cleaning chemical solution causes a difference in detergency. It is necessary to control the thickness of the thermal oxide film with good reproducibility and high accuracy while maintaining the detergency at a constant level.

The present invention has been made to solve the above-mentioned problems. An object of the present invention is to provide a method for forming a thermal oxide film on a semiconductor substrate by which thermal oxide film can be formed with intended thin thickness with good reproducibility while without changing the composition of the cleaning chemical solution.

Solution to Problem

The present invention has been made to achieve the above objects, and provides a method for forming a thermal oxide film on a semiconductor substrate, comprising the steps of: first correlation acquisition step of acquiring a correlation between an amount of OH groups in a chemical oxide film and thickness of the thermal oxide film as a first correlation by forming a thermal oxide film by thermal oxidation treatment under the same condition to a plurality of semiconductor substrates after preparing the plurality of semiconductor substrates having chemical oxide films formed by cleaning in advance and having different amounts of OH groups contained in the chemical oxide films; second correlation acquisition step of acquiring a correlation between an amount of OH groups in a chemical oxide film and drying conditions as a second correlation by forming chemical oxide film under the same cleaning condition followed by changed drying conditions to a plurality of semiconductor substrates and measuring amounts of OH groups contained in the each chemical oxide films; third correlation acquisition step of acquiring a correlation between drying condition after cleaning of semiconductor substrates and thickness of thermal oxide film as a third correlation by using the first correlation and the second correlation; a drying and thermal oxidation condition determining steps to determine drying condition and thermal oxidation condition by using the third correlation so that the thickness of the thermal oxide film on the semiconductor substrate on which the thermal oxide film is to be formed becomes a predetermined thickness; a cleaning step of cleaning the semiconductor substrate on which the thermal oxide film is to be formed; and a drying step and a thermal oxide film formation step for drying and thermal oxidation of the semiconductor substrate on which the thermal oxide film is to be formed after the cleaning step using the drying conditions and thermal oxidation treatment conditions determined in the drying and thermal oxidation treatment condition determination step.

According to such a method for forming a thermal oxide film on a semiconductor substrate, a thermal oxide film can be formed with intended thin thickness with good reproducibility while without changing the composition of the cleaning chemical solution. As a result, the management of the thermal oxide film formation process becomes easy.

At this time, in the drying and the thermal oxidation treatment condition determination step, the thermal oxidation treatment condition is determined to be the same condition as the thermal oxidation treatment condition in the first correlation acquisition step.

As a result, it is possible to easily form a thermal oxide film having a constant thickness with high reproducibility and accuracy.

At this time, further comprising a thermal oxide film thickness estimation step of estimating the thickness of the thermal oxide film of using the third correlation so that it is assumed that the initial values of the drying conditions of the semiconductor substrate are set, and the semiconductor substrate on which the thermal oxide film is to be formed is processed under the same drying conditions as the initial values and the thermal oxidation treatment conditions in the first correlation acquisition step; in the drying and thermal oxidation treatment condition determination step, the drying conditions and thermal oxidation treatment conditions are determined based on the thermal oxide film thickness estimated in the thermal oxide film thickness estimation step.

As a result, it is possible more easily and stably to form a thermal oxide film having a constant thickness with high accuracy and reproducibility.

At this time, in the thermal oxide film thickness estimation step, when the estimated thickness of the thermal oxide film is greater than the predetermined thickness, in the drying and thermal oxidation treatment condition determination step, the drying temperature is determined as the drying condition to be a drying temperature higher than the initial value of the drying temperature of the drying condition in the thermal oxide film thickness estimation step;

when the estimated thickness of the thermal oxide film is smaller than the predetermined thickness, in the drying and thermal oxidation treatment condition determination step, the drying temperature is determined as the drying condition to be a drying temperature lower than the initial value of the drying temperature of the drying condition in the thermal oxide film thickness estimation step;

when the estimated thickness of the thermal oxide film is the same as the predetermined thickness, in the drying and thermal oxidation treatment condition determination step, the drying temperature is determined as the drying condition to be a drying temperature same as the initial value of the drying temperature of the drying condition in the thermal oxide film thickness estimation step.

Further, in the thermal oxide film thickness estimation step, when the estimated thickness of the thermal oxide film is greater than the predetermined thickness, in the drying and thermal oxidation treatment condition determination step, the drying time is determined as the drying condition to be a drying time longer than the initial value of the drying time of the drying condition in the thermal oxide film thickness estimation step; when the estimated thickness of the thermal oxide film is smaller than the predetermined thickness, in the drying and thermal oxidation treatment condition determination step, the drying time is determined as the drying condition to be a drying time shorter than the initial value of the drying time of the drying condition in the thermal oxide film thickness estimation step; when the estimated thickness of the thermal oxide film is the same as the predetermined thickness, in the drying and thermal oxidation treatment condition determination step, the drying time is determined as the drying condition to be a drying time same as the initial value of drying time of the drying condition in the thermal oxide film thickness estimation step.

Further, in the thermal oxide film thickness estimation step;

when the estimated thickness of the thermal oxide film is greater than the predetermined thickness, in the drying and thermal oxidation treatment condition determination step, the heat treatment time is determined as the thermal oxidation treatment condition to be a heat treatment time shorter than the heat treatment time of the heat treatment condition in the thermal oxide film thickness estimation step;

when the estimated thickness of the thermal oxide film is smaller than the predetermined thickness, in the drying and thermal oxidation treatment condition determination step, the heat treatment time is determined as the thermal oxidation treatment condition to be a heat treatment time longer than the heat treatment time of the heat treatment condition in the thermal oxidation film thickness estimation step; when the estimated thickness of the thermal oxide film is the same as the predetermined thickness, in the drying and thermal oxidation treatment condition determination step, the heat treatment time is determined as the thermal oxidation treatment condition to be a heat treatment time same as the heat treatment time of the heat treatment condition in the thermal oxidation film thickness estimation step.

Further, in the thermal oxide film thickness estimation step;

when the estimated thickness of the thermal oxide film is greater than the predetermined thickness, in the drying and thermal oxidation treatment condition determination step, the heat treatment temperature is determined as the thermal oxidation treatment condition to be a heat treatment temperature lower than the heat treatment temperature of the heat treatment condition in the thermal oxide film thickness estimation step; when the estimated thickness of the thermal oxide film is smaller than the predetermined thickness, in the drying and thermal oxidation treatment condition determination step, the heat treatment temperature is determined as the thermal oxidation treatment condition to be a heat treatment temperature higher than the heat treatment temperature of the heat treatment condition in the thermal oxidation film thickness estimation step; when the estimated thickness of the thermal oxide film is the same as the predetermined thickness, in the drying and thermal oxidation treatment condition determination step, the heat treatment temperature is determined as the thermal oxidation treatment condition to be a heat treatment temperature same as the heat treatment temperature of the heat treatment condition in the thermal oxidation film thickness estimation step.

As a result, it is possible more easily to form a thermal oxide film having a constant thickness with high reproducibility and accuracy.

At this time, the predetermined thickness can be 1 to 10 nm.

If the thickness of the thermal oxide film to be formed is within such a range, a thin thermal oxide film having a constant thickness can be formed with better reproducibility.

At this time, the amount of the OH group is calculated from the absorbance of the OH group near $3300 \text{ cm}^{-1}$ by performing ATR-FT-IR measurement of the chemical oxide film using an ATR measurement prism.

Since ATR-FT-IR is more sensitive to OH groups present on the surface than general transmission FT-IR, it is possible to evaluate the amount of OH groups with higher accuracy.

At this time, the semiconductor substrate can be a silicon wafer, and the thermal oxide film can be a silicon oxide film.

The method of forming a thermal oxide film on a semiconductor substrate according to the present invention is particularly suitable for forming a silicon oxide film on a silicon wafer.

At this time, a semiconductor device can be produced by using a semiconductor substrate with a thermal oxide film produced by the above method for forming a thermal oxide film on a semiconductor substrate.

As a result, a semiconductor device can be produced using a semiconductor substrate having a high-quality thin thermal oxide film with no variation between substrates, so that the uniformity of quality can be maintained and the yield can be improved, can be expected.

Advantageous Effects of Invention

As described above, according to the present invention, it is possible to form a thermal oxide film having an intended thin thickness with good reproducibility without changing the composition of the cleaning chemical solution. As a result, the management of the thermal oxide film formation process becomes easy.

BRIEF DESCRIPTION OF THE DRAWINGS

FIG. 1 shows a flow of a method for forming a thermal oxide film on a semiconductor substrate according to the present invention;

FIG. 2 shows the relationship between the amount of OH groups (absorbance at 3300 cm$^{-1}$) and the thickness of the thermal oxide film, which is an example of the first correlation;

FIG. 3 shows the relationship between the drying temperature and the amount of OH groups (absorbance at 3300 cm$^{-1}$), which is an example of the second correlation; and FIG. 4 shows the relationship between the drying temperature and the film thickness of the thermal oxide film, which is an example of the third correlation.

DESCRIPTION OF EMBODIMENTS

The present invention will be described in detail below, but the present invention is not limited to these.

As described above, there has been a demand for a method of forming a thermal oxide film on a semiconductor substrate, which can form a thin thermal oxide film with good reproducibility without changing the composition of the cleaning chemical solution.

As a result of intensive studies on the above problems, the inventors of the present invention have found that by a method for forming a thermal oxide film on a semiconductor substrate, comprising the steps of: first correlation acquisition step of acquiring a correlation between an amount of OH groups in a chemical oxide film and thickness of the thermal oxide film as a first correlation by forming a thermal oxide film by thermal oxidation treatment under the same condition to a plurality of semiconductor substrates after preparing the plurality of semiconductor substrates having chemical oxide films formed by cleaning in advance and having different amounts of OH groups contained in the chemical oxide films; second correlation acquisition step of acquiring a correlation between an amount of OH groups in a chemical oxide film and drying conditions as a second correlation by forming chemical oxide film under the same cleaning condition followed by changed drying conditions to a plurality of semiconductor substrates and measuring amounts of OH groups contained in the each chemical oxide films; third correlation acquisition step of acquiring a correlation between drying condition after cleaning of semiconductor substrates and thickness of thermal oxide film as a third correlation by using the first correlation and the second correlation; a drying and thermal oxidation condition determining steps to determine drying condition and thermal oxidation condition by using the third correlation so that the thickness of the thermal oxide film on the semiconductor substrate on which the thermal oxide film is to be formed becomes a predetermined thickness; a cleaning step of cleaning the semiconductor substrate on which the thermal oxide film is to be formed; and a drying step and a thermal oxide film formation step for drying and thermal oxidation of the semiconductor substrate on which the thermal oxide film is to be formed after the cleaning step using the drying conditions and thermal oxidation treatment conditions determined in the drying and thermal oxidation treatment condition determination step, a thermal oxide film can be formed with intended thin thickness with good reproducibility while without changing the composition of the cleaning chemical solution, as a result, the management of the thermal oxide film formation process becomes easy and have been completed the present invention.

Description will be made below with reference to the drawings.

First Embodiment

First, a method for forming a thermal oxide film on a semiconductor substrate according to the first embodiment of the present invention will be described with reference to FIGS. 1 to 4.

(First Correlation Acquisition Step)

First, a plurality of semiconductor substrates is prepared. Silicon wafers are preferably used as the semiconductor substrates. In this case, the formed thermal oxide film is a silicon oxide film. Silicon wafers are widely used as semiconductor substrates. In particular, a thermal oxide film is formed in the process of producing semiconductor devices (devices). A more accurate evaluation can be made by performing evaluation to a silicon wafer itself after forming thermal oxide film.

Next, the surface of the prepared semiconductor substrate is preferably cleaned with an aqueous HF solution (hydrofluoric acid) in order to remove the oxide film from the surface. After cleaning with an aqueous HF solution to remove the oxide film, the substrate is further cleaned. The cleaning method performed after cleaning using an aqueous HF solution is not particularly limited. For example, cleaning using chemicals such as SC1 cleaning and O$_3$ cleaning can be performed, or cleaning such as pure water rinsing can also be performed. A chemical oxide film is formed on the surface of the semiconductor substrate by the cleaning performed after the cleaning using the aqueous HF solution. At this time, the amounts of OH groups contained in the chemical oxide films of the plurality of semiconductor substrates are set to be different from each other. When the cleaning is performed using a chemical solution, it is preferable to use chemical solutions having different concentrations of OH groups because it is possible to easily obtain semiconductor substrates having different amounts of OH groups in the chemical oxide film. Furthermore, in SC1 cleaning, the higher becomes the concentration of $NH_4OH$ groups and the stronger the alkalinity, the higher becomes the absorbance at 3300 cm$^{-1}$ (that is, the more OH groups are included). Therefore, it is preferable because semiconductor substrates having different amounts of OH groups therein can be provided easily by changing the $NH_4OH$ concentration. Since the range in which the correlation between the concentration of the chemical solution and the amount of OH groups can be obtained varies depending on the cleaning method, it is preferable to obtain a correlation between the plural number of cleaning conditions and the amount of OH groups by performing a plurality of cleanings under as many different cleaning types and/or cleaning conditions as possible in order to obtain the correlation.

Next, the amount of OH groups contained in each chemical oxide film formed by each cleaning method is measured. At this time, it is preferable to perform ATR-FT-IR measurement of the chemical oxide film using an ATR measurement prism. ATR-FT-IR measurement can evaluate OH groups present on the surface of a semiconductor substrate with sufficient sensitivity compared to general transmission FT-IR.

The amount of OH groups contained in the chemical oxide film can be determined, for example, by examining the infrared absorption characteristics of the chemical oxide film. As a measurement of infrared absorption characteristics, for example, ATR-FT-IR measurement is performed, and the amount of OH groups can be calculated from the relative absorbance near 3300 cm$^{-1}$. In this case, the value of the relative absorbance near 3300 cm$^{-1}$ can be used as an indicator of the amount of OH groups.

Next, the plurality of semiconductor substrates having different amounts of OH groups contained in the chemical oxide film are thermally oxidized under the same thermal oxidation conditions to form a thermal oxide film. Conditions for forming the thermal oxide film are not particularly limited, and the formation can be carried out by a usual method. Then, the thickness of the formed thermal oxide film is measured. The measurement can be performed, for example, by spectroscopic ellipsometer or the like.

FIG. 2 is a diagram showing a first correlation showing the actual relationship between the amount of OH groups in the chemical oxide film on the surface of the silicon substrate and the thickness of the silicon thermal oxide film. The heat treatment conditions at this time are a temperature of 900° C., oxygen of 5%, and 60 minutes. It can be seen that the thickness of the thermal oxide film increases as the relative absorbance at 3300 cm$^{-1}$ (the amount of OH groups) increases. This phenomenon is considered to be caused by the difference in the amount of OH groups contained in the chemical oxide film formed on the surface, similar to the fact that the oxidation rate of wet oxidation is higher than that of dry oxidation in the case of thermal oxidation using gas.

The amount of OH groups in the chemical oxide film (relative absorbance near 3300 cm$^{-1}$) and the thickness of the thermal oxide film are also measured using the same cleaning treatment and the thermal oxidation treatment as those for the semiconductor substrate on which the thermal oxide film is formed. A processed monitor wafer or the like can be used, or a part of a semiconductor substrate that has undergone the same processing can be extracted.

(Second Correlation Acquisition Step)

In the second correlation acquisition step, the amount of OH groups in the chemical oxide film is measured for each of a plurality of semiconductor substrates on which the chemical oxide film is formed by changing the drying conditions after cleaning under the same cleaning conditions, and a correlation between the drying conditions and the amount of OH groups in the chemical oxide film is obtained as the second correlation. As the drying conditions, parameters that affect the amount of OH groups can be appropriately selected. For example, drying temperature and drying time can be employed. In the following description, an example in which the drying temperature is used as a parameter will be described.

Next, the surface of the prepared semiconductor substrate is preferably cleaned with an aqueous HF solution (hydrofluoric acid) in order to remove the oxide film from the surface. After cleaning with an aqueous HF solution to remove the oxide film, the substrate is further cleaned. The cleaning method performed after cleaning with the aqueous HF solution is not particularly limited. For example, cleaning using chemicals such as SC1 cleaning and $O_3$ cleaning can be performed depending on the purpose, or cleaning such as pure water rinsing can also be performed. After that, the drying temperature of the semiconductor substrate is changed. Chemical oxide films with different compositions are formed on the plurality of prepared semiconductor substrates by changing the post-cleaning drying temperature performed after the HF cleaning. The lower becomes the drying temperature of the semiconductor substrate at this time, the larger becomes the absorbance at 3300 cm$^{-1}$ (that is, the more OH groups are included). It is preferable because it can be easily obtained as a substrate having different amount of OH groups in chemical oxide film by changing drying temperature.

Next, the amount of OH groups contained in each chemical oxide film at each drying temperature is measured. The measurement of the amount of OH groups is as described in the first correlation acquisition step.

FIG. 3 shows the relationship between the drying temperature and the amount of OH groups in the chemical oxide film on the surface of the silicon substrate as the second correlation when the drying temperature is changed in the drying step of the silicon substrate after SC1 cleaning by the above method. The drying time was standardized to 3 minutes. It can be seen that the amount of OH groups decreases as the drying temperature increases.

As described above, the drying time can be used as the drying condition instead of the drying temperature. The amount of OH groups tends to decrease as the drying time increases.

The order of performing the first correlation acquisition step and the second correlation acquisition step is not limited. After measuring the amount of OH groups in the chemical oxide film for each of a plurality of semiconductor substrates on which a chemical oxide film is formed by changing drying conditions after cleaning under the same cleaning conditions to obtain a second correlation, then the first correlation can also be obtained by performing thermal oxidation treatment on the plurality of semiconductor substrates. In this case, since the first correlation and the second correlation can be obtained from the same semiconductor substrate, a more accurate correlation can be obtained.

(Third Correlation Acquisition Step)

In the third correlation acquisition step, the first correlation and the second correlation are used to obtain the correlation between the drying conditions after cleaning the semiconductor substrate and the thickness of the thermal oxide film as the third correlation. FIG. 4 is a diagram showing the third correlation obtained using the first correlation and the second correlation. Specifically, it shows the relationship between the drying temperature and the thickness of the thermal oxide film after drying the silicon substrate after SC1 cleaning by changing the drying temperature, the thermal oxidation conditions (for example, 900° C., 5% oxygen, 60 min.) are fixed and thermal oxidation is performed. It can be seen from FIG. 4 that the thickness of the thermal oxide film decreases as the drying temperature increases. From the discussion so far, this is because the amount of OH groups in the chemical oxide film on the surface of the silicon substrate decreases as the drying temperature increases.

(Drying and Thermal Oxidation Treatment Condition Determination Step)

Next, in the first embodiment, without performing the "thermal oxide film thickness estimation step" shown in FIG. 1, the above third correlation is used to determine the drying conditions and the thermal oxidation treatment conditions such that the thickness of the thermal oxide film on the semiconductor substrate to be thermally oxidized becomes a predetermined thickness. In the diagram showing the third correlation in FIG. 4, the horizontal axis indicates the drying temperature (° C.) and the vertical axis indicates the thermal oxide film thickness (nm). Since the first correlation used for obtaining the third correlation includes the thermal oxidation treatment conditions, it can be said that the third correlation reflects the thermal oxidation treatment conditions. Specifically, in the third correlation shown in FIG. 4, when the thermal oxidation treatment conditions (for example, the heat treatment temperature is high and the heat treatment time is long) that makes the oxide film thicker, the third correlation shown in FIG. 4 shifts to the upper right. On the other hand, when the thermal oxidation treatment conditions are such that the oxide film thickness becomes thin, the third correlation shown in FIG. 4 shifts to the lower left. Using such a relationship, the third correlation shown in FIG. 4 can be used to determine the drying conditions and the thermal oxidation treatment conditions.

For example, when the oxidation conditions are fixed, the amount of OH groups is changed by adjusting the drying conditions of the semiconductor substrate so as to obtain a predetermined thermal oxide film thickness. Drying conditions for semiconductor substrates include, for example, drying temperature and time, and the amount of OH groups tends to decrease as the temperature increases and the time increases. Considering the takt time of the cleaning step, it is considered common and preferable to change the drying temperature among the drying conditions. On the other hand, when the drying conditions are fixed, it is possible to form an oxide film having a target thickness with good reproducibility by adjusting the thermal oxidation conditions (oxidation time, oxidation temperature, etc.).

In particular, it is preferable to determine the thermal oxidation treatment conditions to the same conditions as the thermal oxidation treatment conditions in the first correlation acquisition step. In this way, the third correlation shown in FIG. 4 is used as it is, the target thermal oxide film thickness (nm) is selected from the vertical axis of the thermal oxide film thickness, and the corresponding drying temperature can be determined simply and accurately as drying conditions for a semiconductor substrate on which a thermal oxide film is to be formed.

The predetermined thickness mentioned above is preferably 1 to 10 nm. If the target (aim) thickness of the thermal oxide film to be formed is within such a range, a thin thermal oxide film having a constant thickness can be formed with better reproducibility.

(Cleaning Step)

Next, a process for forming a thermal oxide film is performed on the semiconductor substrate on which the thermal oxide film is to be formed. First, a semiconductor substrate on which a thermal oxide film is to be formed is cleaned. The cleaning conditions are the same as the cleaning conditions when the second correlation has been obtained.

(Drying Step, Thermal Oxide Film Forming Step)

In the drying step and thermal oxide film forming step following the cleaning step, drying and thermal oxidation are performed using the drying conditions and the thermal oxidation treatment conditions determined in the drying and the thermal oxidation treatment condition determination step.

According to the method for forming a thermal oxide film on a semiconductor substrate according to the first embodiment, it is possible to easily form a thermal oxide film having an intended thin thickness with good reproducibility without changing the composition of the cleaning chemical. As a result, the management of the thermal oxide film forming step becomes easy.

Second Embodiment

In the second embodiment, as shown in FIG. 1, it differs from the first embodiment in that a "thermal oxide film thickness estimation step" is performed before the drying and the thermal oxidation treatment condition determination step in the first embodiment described above, and the drying conditions and the thermal oxidation conditions are determined based on the thermal oxide film thickness estimated in the thermal oxide film thickness estimation step in the drying and the thermal oxidation treatment condition determination step. A thermal oxide film thickness estimation step is a step of estimating the thickness of the thermal oxide film using the third correlation so that it is assumed that the initial values of the drying conditions of the semiconductor substrate are set, and the semiconductor substrate on which the thermal oxide film is to be formed is processed under the same drying conditions as the initial values and the thermal oxidation treatment conditions in the first correlation acquisition step.

(Thermal Oxide Film Thickness Estimation Step)

First, the initial values for the drying conditions for the semiconductor substrate are set. The selection of the initial value at this time is not particularly limited, and the drying conditions desired to be used in the actual processing may be selected, or the drying conditions in the previous actual processing may be selected. The set initial value of the drying condition and the thickness of the thermal oxide film when it is assumed that the treatment is performed under the thermal oxidation treatment conditions in the first correlation acquisition step are estimated using the third correlation. Specifically, in FIG. 4, the thickness of the thermal oxide film can be estimated by reading the thermal oxide film thickness (vertical axis) corresponding to the drying temperature (horizontal axis) corresponding to the initial value.

(Drying and Thermal Oxidation Treatment Condition Determination Step)

In the drying and the thermal oxidation treatment condition determination step following the thermal oxide film thickness estimation step, the drying conditions and the thermal oxidation treatment conditions are determined based on the thermal oxide film thickness estimated in the thermal oxide film thickness estimation step as described above. At this time, one of the drying conditions and the thermal oxidation treatment conditions is determined as a desired condition, and the other is adjusted to determine the drying conditions and the thermal oxidation treatment conditions.

First, determination of drying conditions will be specifically described. The thickness of the thermal oxide film obtained in the thermal oxide film thickness estimation step is compared with a predetermined target thickness of the thermal oxide film. If these thicknesses are the same, the same drying conditions (that is, the initial values) as the drying conditions in the thermal oxide film thickness estimation step are determined as the drying conditions for the semiconductor substrate on which the thermal oxide film is to be formed.

If the estimated thickness of the thermal oxide film deviates from the target value, the drying conditions are determined by adjusting the drying conditions based on the initial value of the drying conditions in the thickness estimation step of the thermal oxide film so that the target thickness of the thermal oxide film can be obtained.

For example, in the second correlation, when the drying temperature is changed as the drying condition and the correlation between the drying temperature and the amount of OH groups in the chemical oxide film is obtained, the third correlation is the correlation between the drying temperature and the thickness of the thermal oxide film as shown in FIG. 4. Then, when the thermal oxide film thickness is estimated to be thicker than the target thickness in the thermal oxide film thickness estimation step, the temperature is adjusted to a temperature higher than the initial value of the drying temperature of the drying conditions in the thermal oxide film thickness estimation step, and the adjusted temperature is determined as the drying conditions for the semiconductor substrate to be thermally oxidized. When the thermal oxide film thickness is estimated to be thinner than the target thickness, the temperature is adjusted to a temperature lower than the initial value of the drying temperature of the drying conditions in the thermal oxide film thickness estimation step, and is determined as the drying conditions for the semiconductor substrate on which the thermal oxide film is to be formed.

Also, in the second correlation, when the drying time is changed as the drying condition and the correlation between the drying time and the amount of OH groups in the chemical oxide film is obtained, the third correlation is the correlation between the drying time and the thermal oxide film thickness. Then, when the thermal oxide film thickness is estimated to be thicker than the target thickness in the thermal oxide film thickness estimation step, the drying time is adjusted to a time longer than the initial value of the drying time of the thermal oxide film thickness estimation step and the adjusted drying time is determined as the drying conditions for the semiconductor substrate to be thermally oxidized. When the thermal oxide film thickness is estimated to be thinner than the target thickness, the drying time is adjusted to a time shorter than the initial value of the drying time of the thermal oxide film thickness estimation step and the adjusted time is determined as the drying conditions for the semiconductor substrate on which the thermal oxide film is to be formed.

Next, determination of the thermal oxidation conditions will be specifically described. The thickness of the thermal oxide film obtained in the thermal oxide film thickness estimation step is compared with a predetermined target thickness of the thermal oxide film, and when the estimated thickness of the thermal oxide film is the same as the target thickness of the thermal oxide film, the same thermal oxidation condition (that is, the initial value) as the thermal oxidation condition in the thermal oxide film thickness estimation step is determined as the thermal oxidation condition of the semiconductor substrate on which the thermal oxide film is to be formed.

If the estimated thickness of the thermal oxide film deviates from the target value, the thermal oxidation conditions in the thermal oxide film thickness estimation step are used as a reference so as to obtain the target thickness of the thermal oxide film. Then, the thermal oxidation conditions are determined by adjusting the thermal oxidation conditions, for example, the thermal oxidation temperature and the thermal oxidation time.

For example, when the thermal oxide film thickness is estimated to be thicker than the target thickness in the thermal oxide film thickness estimation step, the time is adjusted to a time shorter than the initial value of the heat treatment time of the thermal oxidation conditions in the thermal oxide film thickness estimation step, and determined as the thermal oxidation conditions for the semiconductor substrate on which the thermal oxide film is to be formed. When the thermal oxide film thickness is estimated to be thinner than the target thickness, the time is adjusted to a time longer than the initial value of the heat treatment time, and determined as the thermal oxidation conditions for the semiconductor substrate on which the thermal oxide film is to be formed.

In the thermal oxide film thickness estimation step, when the thickness is estimated to be thicker than the target thickness, the temperature is adjusted to a temperature lower than the initial value of the heat treatment temperature of the thermal oxidation conditions in the thermal oxide film thickness estimation step and determined as the thermal oxidation conditions for the semiconductor substrate on which the thermal oxide film is to be formed. When the thickness is estimated to be thinner than the target thickness, the temperature is adjusted to a temperature higher than the initial value of the heat treatment temperature of the thermal oxidation conditions in the thermal oxide film thickness estimation step and determined as a thermal oxidation condition for a semiconductor substrate on which the oxide film is to be formed.

In the present invention, it is also possible to control the oxide film thickness to a predetermined thickness by adjusting not only the heat treatment time and the heat treatment temperature but also the oxygen concentration in the heat treatment atmosphere.

As in the first embodiment, after cleaning the semiconductor substrate on which the thermal oxide film is to be formed, drying and the thermal oxidation is performed under the drying conditions and the thermal oxide film forming conditions determined as above so that the thickness of the thermal oxide film reaches the target thickness.

Third Embodiment

The adjustment of the drying conditions and the adjustment of the thermal oxidation conditions can be performed independently, but it is also preferable to determine the drying conditions and the thermal oxidation conditions by combining the adjustment of the drying conditions and the adjustment of the thermal oxidation conditions. In particular, using the third correlation, when the drying condition or the oxidation condition is determined by adjusting only the drying conditions or by adjusting only the thermal oxidation conditions for the target thermal oxide film thickness, if the thickness is not become the target thermal oxide, it is also possible to determine the drying conditions and thermal oxidation conditions of the semiconductor substrate on which the thermal oxide film is to be formed by combining the adjustment of the drying conditions and the adjustment of the thermal oxidation conditions, and adjusting the drying conditions and thermal oxidation conditions based on the drying conditions and thermal oxidation conditions in the thermal oxide film thickness estimation step.

For example, when a thermal oxide film is formed by drying under the determined drying conditions, the estimated thickness of the thermal oxide film is compared with the target thickness of the thermal oxide film, if the thickness of thermal oxide film is not the target thickness, the third correlation can be used to adjust and determine the thermal oxidation conditions based on the thermal oxidation conditions in the thermal oxide film thickness estimation step. Alternatively, when a thermal oxide film is formed by oxidizing under the determined oxidation conditions, the estimated thickness of the thermal oxide film is compared with the target thickness of the thermal oxide film, if the thickness of thermal oxide film is not the target thickness, the third correlation can further be used to adjust and determine the drying conditions.

(Method for Producing Semiconductor Device)

A semiconductor device can be produced using a semiconductor substrate with a thermal oxide film produced by the method for forming a thermal oxide film on a semiconductor substrate as described above. Since a semiconductor device can be produced using a semiconductor substrate having a high-quality thin thermal oxide film without variation between substrates, effects such as maintaining uniformity of quality and improving yield can be expected.

Examples

The present invention will be specifically described below with reference to Examples, but these are not intended to limit the present invention.

Example 1

In this example, the experiment was conducted with the target value of the film thickness of the thermal oxide film formed on the semiconductor substrate on which the thermal oxide film was to be formed was set to 5.1 nm. First, silicon wafers having a diameter of 300 mm, boron doping, and normal resistance were prepared as semiconductor substrates and wafers having different amount of OH groups in the chemical oxide film were produced by drying at drying temperatures at 30, 60, 80, 200, and 300° C. after SC1 cleaning. The drying time was set to 3 minutes in common. Thereafter, the silicon wafers were cut out and subjected to ATR-FT-IR measurement, and the absorbance at 3300 cm$^{-1}$ was measured to determine the amount of OH groups in the chemical oxide film. As a result, a second correlation showing the correlation between the drying conditions (drying temperature) and the amount of OH groups in the chemical oxide film was obtained (FIG. 3).

Next, a predetermined thermal oxidation treatment (900° C., 5% oxygen, 60 minutes) were performed for each wafer under each drying condition, and the thickness of the thermal oxide film was measured to obtain a relationship between the amount of OH groups in the chemical oxide film and thermal oxide film thicknesses. The target thickness of the thermal oxide film at this time was set to 5.1 nm. As a result, a first correlation indicating the correlation between the amount of OH groups in the chemical oxide film and the thickness of the thermal oxide film was obtained (FIG. 2).

Then, the third correlation shown in FIG. 4 was obtained from the first correlation shown in FIG. 2 and the second correlation shown in FIG. 3.

Next, two drying temperatures of 50° C. and 300° C. were set as the initial values of the drying conditions. For verification purposes, boron-doped normal resistance silicon wafers with a diameter of 300 mm were prepared and wafers having different amount of OH groups in the chemical oxide film were produced by drying at drying temperatures at 50° C. and 300° C. after SC1 cleaning. Thereafter, a measurement sample was cut out from the silicon wafer and subjected to ATR-FT-IR measurement, and the absorbance at 3300 cm$^{-1}$ corresponding to the amount of OH groups was measured. It was 0.18 for the drying temperature of 50° C. and it was 0.11 for the drying temperature of 300° C.

Based on the initial values of the drying conditions and the third correlation in FIG. 4, the thickness of thermal oxide films were estimated after thermal oxidation under conditions of 900° C., 5% oxygen, 60 minutes. It was 5.17 nm at the drying temperature of 50° C., and 5.07 nm at the drying temperature of 300° C. It was assumed that the amount of OH groups differed and the thickness of the thermal oxide film differed at different drying temperatures. Therefore, using the third correlation in FIG. 4, it was predicted that a drying temperature of 200° C. would result in a thermal oxide film thickness of 5.1 nm. Consequently, the drying temperature and drying time were determined to be 200° C. and 3 min, respectively. Actually, a silicon wafer dried under these drying conditions was thermally oxidized (900° C., 5% oxygen, 60 min) to form a thermal oxide film. When the thickness of the thermal oxide film was measured by spectroscopic ellipsometer, the thermal oxide film having a thickness of 5.1 nm was formed as expected.

Example 2

As in Example 1, the first, second, and third correlations are obtained, the initial values of the drying conditions (50° C., 300° C.) were set, and by using the third correlation in FIG. 4, the thickness of the thermal oxide film when thermally oxidized under conditions of 900° C., 5% oxygen, 60 minutes was estimated. Then, the thermal oxidation time was adjusted based on the third correlation shown in FIG. 4 (drying conditions were fixed), thermal oxidation time was determined to be 58 minutes for drying temperature of 50° C. and thermal oxidation time was determined to be 63 minutes for drying temperature of 300° C. When drying and thermal oxidation treatment were performed under the actually determined conditions, the target thermal oxide film thickness of 5.1 nm was achieved at both drying temperatures of 50° C. and 300° C.

Example 3

As in Examples 1 and 2, the first, second, and third correlations are obtained, the initial values of the drying conditions (50° C., 300° C.) were set, and the thickness of the thermal oxide film when thermally oxidized under conditions of 900° C., 5% oxygen, 60 minutes was estimated using the third correlation. Then, both the drying temperature and the thermal oxidation time were adjusted based on the third correlation, and the drying temperature was set at 250° C. and the thermal oxidation time was set at 62 minutes. When drying and thermal oxide film formation were carried out under these conditions, a target thermal oxide film of 5.1 nm was obtained.

Comparative Example

Boron-doped normal resistance silicon wafers with a diameter of 300 mm were prepared, and after SC1 cleaning, drying was performed at a drying temperature of 50° C. and 300° C., respectively, to produce wafers with different amounts of OH groups in the chemical oxide film. After that, the silicon wafer was cut out and subjected to ATR-FT-IR measurement, and the absorbance at 3300 cm$^{-1}$ corresponding to the amount of OH groups was measured, and it was 0.18 for the drying temperature of 50° C. and it was 0.11 for the drying temperature of 300° C.

For the above two silicon wafers, in order to perform electrical property evaluation such as GOI (Gate Oxide Integrity) measurement, drying and thermal oxidation conditions were not adjusted, and all the same conditions (900° C., 5% oxygen, 60 min). When the thermal oxidation treatment was performed, the film thickness of the thermal oxide film was 5.17 nm for the wafer with a drying temperature of 50° C. and 5.07 nm for the wafer with a drying temperature of 300° C., which deviated from the target of 5.1 nm.

As described above, according to the embodiments of the present invention, it is possible to form a thermal oxide film with an intended thin thickness without changing the composition of the cleaning chemical. As a result, the management of thermal oxide film forming step has been verified to be easy.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A method for forming a thermal oxide film on a semiconductor substrate, comprising the steps of:
first correlation acquisition step of acquiring a correlation between an amount of OH groups in a chemical oxide film and thickness of the thermal oxide film as a first correlation by forming a thermal oxide film by thermal oxidation treatment under the same condition to a plurality of semiconductor substrates after preparing the plurality of semiconductor substrates having chemical oxide films formed by cleaning in advance and having different amounts of OH groups contained in the chemical oxide films;
second correlation acquisition step of acquiring a correlation between an amount of OH groups in a chemical oxide film and drying conditions as a second correlation by forming chemical oxide film under the same cleaning condition followed by changed drying conditions to a plurality of semiconductor substrates and measuring amounts of OH groups contained in the each chemical oxide films;
third correlation acquisition step of acquiring a correlation between drying condition after cleaning of semiconductor substrates and thickness of thermal oxide film as a third correlation by using the first correlation and the second correlation;
a drying and thermal oxidation condition determining steps to determine drying condition and thermal oxidation condition by using the third correlation so that the thickness of the thermal oxide film on the semiconductor substrate on which the thermal oxide film is to be formed becomes a predetermined thickness;

a cleaning step of cleaning the semiconductor substrate on which the thermal oxide film is to be formed; and
a drying step and a thermal oxide film formation step for drying and thermal oxidation of the semiconductor substrate on which the thermal oxide film is to be formed after the cleaning step using the drying conditions and thermal oxidation treatment conditions determined in the drying and thermal oxidation treatment condition determination step.

2. The method for forming a thermal oxide film on a semiconductor substrate according to claim 1, wherein;
in the drying and thermal oxidation treatment condition determination step, the thermal oxidation treatment condition is determined to be the same condition as the thermal oxidation treatment condition in the first correlation acquisition step.

3. The method for forming a thermal oxide film on a semiconductor substrate according to claim 1, wherein;
further comprising a thermal oxide film thickness estimation step of estimating the thickness of the thermal oxide film of using the third correlation so that it is assumed that the initial values of the drying conditions of the semiconductor substrate are set, and the semiconductor substrate on which the thermal oxide film is to be formed is processed under the same drying conditions as the initial values and the thermal oxidation treatment conditions in the first correlation acquisition step;
in the drying and thermal oxidation treatment condition determination step, the drying conditions and thermal oxidation treatment conditions are determined based on the thermal oxide film thickness estimated in the thermal oxide film thickness estimation step.

4. The method for forming a thermal oxide film on a semiconductor substrate according to claim 3, wherein;
in the thermal oxide film thickness estimation step,
when the estimated thickness of the thermal oxide film is greater than the predetermined thickness, in the drying and thermal oxidation treatment condition determination step, the drying temperature is determined as the drying condition to be a drying temperature higher than the initial value of the drying temperature of the drying condition in the thermal oxide film thickness estimation step;
when the estimated thickness of the thermal oxide film is smaller than the predetermined thickness, in the drying and thermal oxidation treatment condition determination step, the drying temperature is determined as the drying condition to be a drying temperature lower than the initial value of the drying temperature of the drying condition in the thermal oxide film thickness estimation step;
when the estimated thickness of the thermal oxide film is the same as the predetermined thickness, in the drying and thermal oxidation treatment condition determination step, the drying temperature is determined as the drying condition to be a drying temperature same as the initial value of the drying temperature of the drying condition in the thermal oxide film thickness estimation step.

5. The method for forming a thermal oxide film on a semiconductor substrate according to claim 3, wherein;
in the thermal oxide film thickness estimation step,
when the estimated thickness of the thermal oxide film is greater than the predetermined thickness, in the drying and thermal oxidation treatment condition determination step, the drying time is determined as the drying condition to be a drying time longer than the initial value of the drying time of the drying condition in the thermal oxide film thickness estimation step;

when the estimated thickness of the thermal oxide film is smaller than the predetermined thickness, in the drying and thermal oxidation treatment condition determination step, the drying time is determined as the drying condition to be a drying time shorter than the initial value of the drying time of the drying condition in the thermal oxide film thickness estimation step;

when the estimated thickness of the thermal oxide film is the same as the predetermined thickness, in the drying and thermal oxidation treatment condition determination step, the drying time is determined as the drying condition to be a drying time same as the initial value of drying time of the drying condition in the thermal oxide film thickness estimation step.

6. The method for forming a thermal oxide film on a semiconductor substrate according to claim 3; wherein, in the thermal oxide film thickness estimation step;

when the estimated thickness of the thermal oxide film is greater than the predetermined thickness, in the drying and thermal oxidation treatment condition determination step, the heat treatment time is determined as the thermal oxidation treatment condition to be a heat treatment time shorter than the heat treatment time of the heat treatment condition in the thermal oxide film thickness estimation step;

when the estimated thickness of the thermal oxide film is smaller than the predetermined thickness, in the drying and thermal oxidation treatment condition determination step, the heat treatment time is determined as the thermal oxidation treatment condition to be a heat treatment time longer than the heat treatment time of the heat treatment condition in the thermal oxidation film thickness estimation step;

when the estimated thickness of the thermal oxide film is the same as the predetermined thickness, in the drying and thermal oxidation treatment condition determination step, the heat treatment time is determined as the thermal oxidation treatment condition to be a heat treatment time same as the heat treatment time of the heat treatment condition in the thermal oxidation film thickness estimation step.

7. The method for forming a thermal oxide film on a semiconductor substrate according to claim 4; wherein, in the thermal oxide film thickness estimation step;

when the estimated thickness of the thermal oxide film is greater than the predetermined thickness, in the drying and thermal oxidation treatment condition determination step, the heat treatment time is determined as the thermal oxidation treatment condition to be a heat treatment time shorter than the heat treatment time of the heat treatment condition in the thermal oxide film thickness estimation step;

when the estimated thickness of the thermal oxide film is smaller than the predetermined thickness, in the drying and thermal oxidation treatment condition determination step, the heat treatment time is determined as the thermal oxidation treatment condition to be a heat treatment time longer than the heat treatment time of the heat treatment condition in the thermal oxidation film thickness estimation step;

when the estimated thickness of the thermal oxide film is the same as the predetermined thickness, in the drying and thermal oxidation treatment condition determination step, the heat treatment time is determined as the thermal oxidation treatment condition to be a heat treatment time same as the heat treatment time of the heat treatment condition in the thermal oxidation film thickness estimation step.

8. The method for forming a thermal oxide film on a semiconductor substrate according to claim 5; wherein, in the thermal oxide film thickness estimation step;

when the estimated thickness of the thermal oxide film is greater than the predetermined thickness, in the drying and thermal oxidation treatment condition determination step, the heat treatment time is determined as the thermal oxidation treatment condition to be a heat treatment time shorter than the heat treatment time of the heat treatment condition in the thermal oxide film thickness estimation step;

when the estimated thickness of the thermal oxide film is smaller than the predetermined thickness, in the drying and thermal oxidation treatment condition determination step, the heat treatment time is determined as the thermal oxidation treatment condition to be a heat treatment time longer than the heat treatment time of the heat treatment condition in the thermal oxidation film thickness estimation step;

when the estimated thickness of the thermal oxide film is the same as the predetermined thickness, in the drying and thermal oxidation treatment condition determination step, the heat treatment time is determined as the thermal oxidation treatment condition to be a heat treatment time same as the heat treatment time of the heat treatment condition in the thermal oxidation film thickness estimation step.

9. The method for forming a thermal oxide film on a semiconductor substrate according to claim 3, wherein;

in the thermal oxide film thickness estimation step;

when the estimated thickness of the thermal oxide film is greater than the predetermined thickness, in the drying and thermal oxidation treatment condition determination step, the heat treatment temperature is determined as the thermal oxidation treatment condition to be a heat treatment temperature lower than the heat treatment temperature of the heat treatment condition in the thermal oxide film thickness estimation step;

when the estimated thickness of the thermal oxide film is smaller than the predetermined thickness, in the drying and thermal oxidation treatment condition determination step, the heat treatment temperature is determined as the thermal oxidation treatment condition to be a heat treatment temperature higher than the heat treatment temperature of the heat treatment condition in the thermal oxidation film thickness estimation step;

when the estimated thickness of the thermal oxide film is the same as the predetermined thickness, in the drying and thermal oxidation treatment condition determination step, the heat treatment temperature is determined as the thermal oxidation treatment condition to be a heat treatment temperature same as the heat treatment temperature of the heat treatment condition in the thermal oxidation film thickness estimation step.

10. The method for forming a thermal oxide film on a semiconductor substrate according to claim 4, wherein;

in the thermal oxide film thickness estimation step;

when the estimated thickness of the thermal oxide film is greater than the predetermined thickness, in the drying and thermal oxidation treatment condition determination step, the heat treatment temperature is determined as the thermal oxidation treatment condition to be a heat treatment temperature lower than the heat treatment temperature of the heat treatment condition in the thermal oxide film thickness estimation step;

when the estimated thickness of the thermal oxide film is smaller than the predetermined thickness, in the drying and thermal oxidation treatment condition determination step, the heat treatment temperature is determined as the thermal oxidation treatment condition to be a heat treatment temperature higher than the heat treatment temperature of the heat treatment condition in the thermal oxidation film thickness estimation step;

when the estimated thickness of the thermal oxide film is the same as the predetermined thickness, in the drying and thermal oxidation treatment condition determination step, the heat treatment temperature is determined as the thermal oxidation treatment condition to be a heat treatment temperature same as the heat treatment temperature of the heat treatment condition in the thermal oxidation film thickness estimation step.

11. The method for forming a thermal oxide film on a semiconductor substrate according to claim 5, wherein;

in the thermal oxide film thickness estimation step;

when the estimated thickness of the thermal oxide film is greater than the predetermined thickness, in the drying and thermal oxidation treatment condition determination step, the heat treatment temperature is determined as the thermal oxidation treatment condition to be a heat treatment temperature lower than the heat treatment temperature of the heat treatment condition in the thermal oxide film thickness estimation step;

when the estimated thickness of the thermal oxide film is smaller than the predetermined thickness, in the drying and thermal oxidation treatment condition determination step, the heat treatment temperature is determined as the thermal oxidation treatment condition to be a heat treatment temperature higher than the heat treatment temperature of the heat treatment condition in the thermal oxidation film thickness estimation step;

when the estimated thickness of the thermal oxide film is the same as the predetermined thickness, in the drying and thermal oxidation treatment condition determination step, the heat treatment temperature is determined as the thermal oxidation treatment condition to be a heat treatment temperature same as the heat treatment temperature of the heat treatment condition in the thermal oxidation film thickness estimation step.

12. The method for forming a thermal oxide film on a semiconductor substrate according to claim 1, wherein the predetermined thickness is 1 to 10 nm.

13. The method for forming a thermal oxide film on a semiconductor substrate according to claim 1, wherein the amount of the OH group is calculated from the absorbance of the OH group near 3300 cm$^{-1}$ by performing ATR-FT-IR measurement of the chemical oxide film using an ATR measurement prism.

14. The method for forming a thermal oxide film on a semiconductor substrate according to claim 1, wherein the semiconductor substrate is a silicon wafer, and the thermal oxide film is a silicon oxide film.

15. A method for producing a semiconductor device wherein, producing a semiconductor device using a semiconductor substrate with a thermal oxide film produced by the method for forming a thermal oxide film on a semiconductor substrate according to claim 1.

* * * * *